(12) United States Patent
Park et al.

(10) Patent No.: US 11,804,446 B2
(45) Date of Patent: Oct. 31, 2023

(54) SEMICONDUCTOR DEVICE

(71) Applicant: SK hynix Inc., Gyeonggi-do (KR)

(72) Inventors: Hyung Jin Park, Gyeonggi-do (KR); Jung Wook Kim, Gyeonggi-do (KR); Hyo Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 116 days.

(21) Appl. No.: 17/360,847

(22) Filed: Jun. 28, 2021

(65) Prior Publication Data

US 2022/0216162 A1 Jul. 7, 2022

(30) Foreign Application Priority Data

Jan. 6, 2021 (KR) .................. 10-2021-0001448

(51) Int. Cl.
*H01L 23/544* (2006.01)
*H01L 23/00* (2006.01)
*H10B 12/00* (2023.01)
*H01L 21/78* (2006.01)

(52) U.S. Cl.
CPC .......... *H01L 23/544* (2013.01); *H01L 23/562* (2013.01); *H01L 21/78* (2013.01); *H01L 2223/5446* (2013.01); *H01L 2223/54426* (2013.01); *H10B 12/30* (2023.02)

(58) Field of Classification Search
CPC ... H01L 2223/5446; H01L 2223/54426; H01L 23/544; H01L 2223/5442
See application file for complete search history.

(56) References Cited

U.S. PATENT DOCUMENTS

| 5,805,421 A | * | 9/1998 | Livengood | B24B 37/013 361/767 |
| 5,963,781 A | * | 10/1999 | Winer | H01L 22/34 438/15 |
| 6,214,703 B1 | * | 4/2001 | Chen | H01L 21/78 438/464 |
| 6,821,867 B2 | * | 11/2004 | Matsuura | H01L 29/66734 257/E23.179 |
| 7,211,500 B2 | | 5/2007 | Chen et al. | |
| 7,952,167 B2 | * | 5/2011 | Lee | H01L 23/585 257/E21.523 |
| 8,841,784 B2 | * | 9/2014 | Ishida | H01L 23/544 257/797 |
| 10,651,105 B2 | * | 5/2020 | Kim | H01L 23/562 |
| 10,777,560 B2 | | 9/2020 | Park et al. | |
| 11,107,680 B2 | * | 8/2021 | Chen | H01L 23/544 |

(Continued)

*Primary Examiner* — Bilkis Jahan
*Assistant Examiner* — Victor V Barzykin
(74) *Attorney, Agent, or Firm* — IP & T GROUP LLP

(57) ABSTRACT

Provided is a semiconductor device capable of improving the divisibility of a wafer by concentrating crack stress by disposing notch patterns on a scribe line of a wafer, by locally removing a metal thin film in a scribe line and propagating a dividing energy in a vertical direction of a die surface. A semiconductor device includes: die regions spaced apart from each other in a wafer, scribe line regions disposed between neighboring ones of the die regions and covered with a metal material layer, and one or more open areas disposed in each of the scribe line regions and formed by locally removing the metal material layer, wherein each of the open areas includes one or more notch patterns indicating a direction in which the scribe line region is extended.

14 Claims, 9 Drawing Sheets

(56) References Cited

U.S. PATENT DOCUMENTS

| | | | | |
|---|---|---|---|---|
| 2003/0216009 | A1* | 11/2003 | Matsuura | H01L 29/66734 |
| | | | | 257/E23.179 |
| 2005/0282360 | A1* | 12/2005 | Kida | H01L 21/78 |
| | | | | 257/E23.179 |
| 2006/0073676 | A1* | 4/2006 | Chen | H01L 21/78 |
| | | | | 438/460 |
| 2008/0265378 | A1* | 10/2008 | Lee | H01L 23/544 |
| | | | | 257/E23.179 |
| 2019/0067001 | A1* | 2/2019 | Chen | H01L 24/19 |
| 2020/0020604 | A1* | 1/2020 | Kim | H01L 22/32 |
| 2021/0391168 | A1* | 12/2021 | Chen | H01L 23/49838 |

* cited by examiner

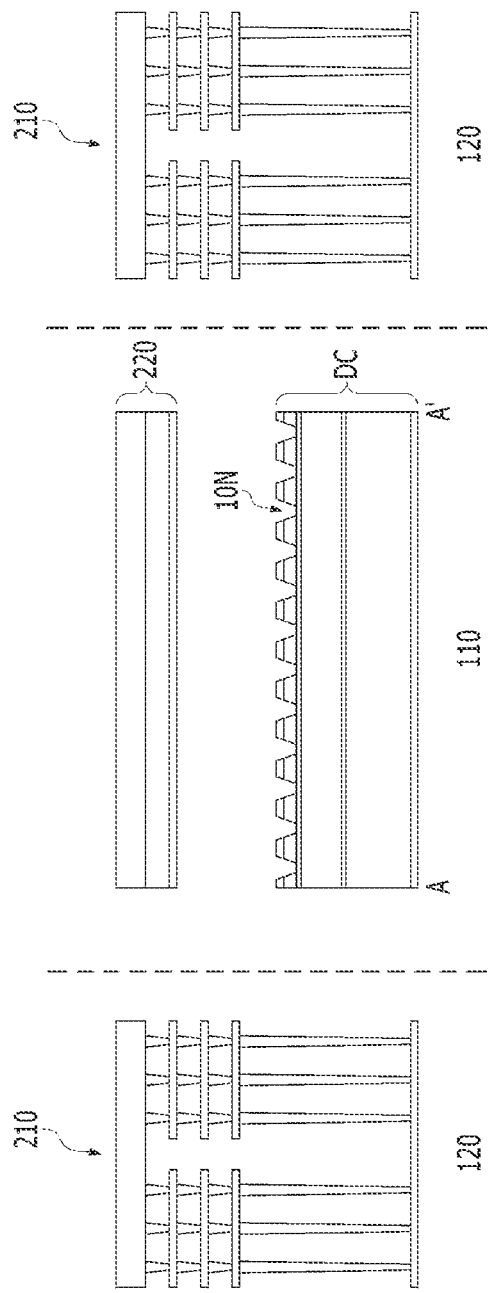

SEMICONDUCTOR DEVICE

CROSS-REFERENCE TO RELATED APPLICATIONS

The present application claims priority to Korean Patent Application No. 10-2021-0001448, filed on Jan. 6, 2021, which is incorporated herein by reference in its entirety.

TECHNICAL FIELD

The present disclosure relates to a semiconductor device and more particularly, an open area including one or more notch patterns formed inside a scribe line of a wafer to aid a wafer sawing.

BACKGROUND

Recently, as the degree of integration of a semiconductor device increases, a width of a scribe line disposed between dies decreases. Thus, it is difficult to apply blade sawing, which is a physical dividing method.

SUMMARY

Various embodiments of the present invention are to provide a semiconductor device capable of improving the divisibility of a wafer by concentrating crack stress by disposing one or more notch patterns on a scribe line of a wafer.

In addition, embodiments of the present invention are to provide a semiconductor device capable of improving divisibility of a wafer by locally removing a metal thin film in a scribe line and propagating a dividing energy in a vertical direction of a die surface.

In accordance with an embodiment of the present invention, a semiconductor device includes die regions spaced apart from each other in a wafer, scribe line regions disposed between neighboring ones of the die regions and covered with a metal material layer, and one or more open areas disposed in each of the scribe line regions and formed by locally removing the metal material layer, wherein each of the open areas includes one or more notch patterns indicating a direction in which the scribe line region is extended.

In accordance with another embodiment of the present invention, a semiconductor device includes die regions spaced apart from each other in a wafer and where semiconductor devices each including a capacitor is formed, scribe line regions disposed between neighboring ones of the die regions and covered with a metal material layer that covers an upper electrode of the capacitor, one or more open areas where the metal material layer is locally removed from the scribe line regions, each of the open areas including one or more notch patterns each indicating one of directions in which the scribe line regions are extended.

Embodiments of the present invention have an effect of improving divisibility of a wafer by including one or more open areas at which the metal material layer is removed from the scribe line regions.

According to embodiments of the present invention, one or more notch patterns each indicating a direction in which the scribe line region extends are disposed in each of the open areas to concentrate crack stress, thereby increasing divisibility of a wafer.

BRIEF DESCRIPTION OF THE DRAWINGS

FIGS. 3A and 3B are cross-sectional views illustrating a semiconductor device according to other embodiments of the present invention.

DETAILED DESCRIPTION

Figure 1:
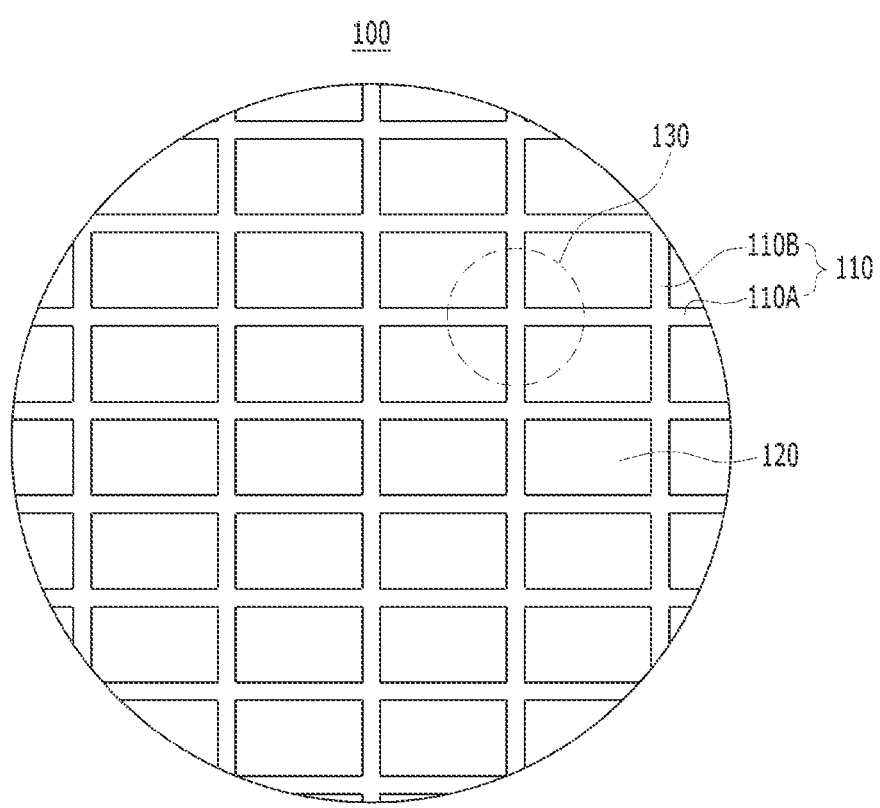
FIG. 1 is a plane view illustrating a semiconductor device according to an embodiment of the present invention.

Various embodiments described herein will be described with reference to cross-sectional views, plane views and block diagrams, which are ideal schematic views of the present invention. Therefore, the structures of the drawings may be modified by fabricating techniques and/or tolerances. The embodiments of the present invention may not be limited to the specific structures shown in the drawings, but may include any changes in the structures that may be produced according to the fabricating process. Accordingly, the regions and the shapes of the regions illustrated in the drawings are intended to illustrate specific structures of regions of the elements, and are not intended to limit the scope of the invention.

A stealth dicing method is proposed to replace a blade sawing method due to an increase in an integration of a semiconductor device. The stealth dicing method utilizes internal cracks of a monocrystalline silicon by irradiating a laser beam inside a wafer and by utilizing localized melting. The stealth dicing method may be performed to separate a die by cutting an inside of a wafer with laser energy, and then by applying an external pressure to a tape attached to a backside of a wafer to cut the skin of the wafer. When pressure is applied to the tape attached to the backside of the wafer, the tape is extended, the wafer is instantly bent upward by an extension of the tape, and the dies are singulated individually. The stealth dicing method has several advantages in that many chips can be put on a wafer because there is no debris generated when dicing the surface directly with a laser and the kerf, which is a width of a cut line, is narrow.

However, metal materials formed on an upper portion of a scribe line of a wafer are an obstacle to a dicing process. The metal materials are included in a photo key including a metal thin film pattern. The metal materials are also included in a test pattern for process monitoring.

Accordingly, embodiments of the present invention described below are to provide a semiconductor device without obstacles of a dicing process and with improved divisibility of a wafer. The embodiments of the present invention illustrate a DRAM device as an example of a semiconductor device. However, the present invention is not limited thereto, and may be applicable to any semiconductor devices including a plurality of die regions and a plurality of scribe line regions.

FIG. 1 is a plane view illustrating a semiconductor device according to an embodiment of the present invention.

As illustrated in FIG. 1, a wafer 100 may include scribe line regions 110 and die regions 120 defined by the scribe line regions 110.

The die regions 120 are regions in which semiconductor devices for signal processing are formed. A semiconductor device may include a cell region in which memory cells are disposed, and a non-cell region surrounding the cell region. A peripheral region (may also be referred to as non-cell region) may surround the cell region and may include a core/peripheral (also referred to as a core/peri) region for receiving and transmitting (also referred to as in/out) of electrical signals to the memory cells. A gate, a bit line, and a capacitor may be formed in the cell region, for example, in a perpendicular direction to a surface of the wafer 100, such as, for example, when a semiconductor device is composed of a DRAM. The peripheral region may further include besides the core/peri region a chip-guard region for preventing cracks during a dicing process.

The scribe line regions 110 may function as a sawing line when a plurality of cell regions is cut and separated into unit chips. The scribe line regions 110 may include auxiliary structures such as a photo key, an electrical evaluation pattern, and a measuring site. An electrical evaluation pattern may include a test pattern for measuring individual or integrated electrical signals of each layer when a plurality of structures is formed in the cell region. A measuring site may be an optical site for physical measurement, such as a thickness of each layer, when a plurality of structures is formed in the cell region. A photo key may be a pattern for aligning a lower structure when a plurality of structures is formed in cell regions, for example, during a photo lithography process. The scribe line regions 110 may be partially or entirely removed during a dicing process.

The scribe line regions 110 may include a first scribe line region 110A extending in a first direction and a second scribe line region 110B extending in a second direction. The first direction and the second directions may vertically intersect. The first scribe line region 110A and the second scribe line region 110B may vertically intersect. The die regions 120 may be defined as the first and second scribe line regions 110A and 110B intersect. The first scribe line region 110A may include a plurality of first straight-line regions extending in the first direction and be disposed to be spaced apart from each other at a constant distance (also referred to as a first interval), which may depend on a size of the die region 120. The second scribe line region 110B may include a plurality of second straight-line regions extending in the second direction and be disposed to be spaced apart from each other at a constant distance (also referred to as a second interval), which may depend on the size of the die region 120. The first and second intervals may be the same or different. A line width and an interval of the scribe line regions 110 may depend on the size of each of the die regions 120.

FIGS. 2A to 2F are plane views illustrating examples of one or more notch patterns according to embodiments of the present invention. FIGS. 2A to 2F are enlarged views of a portion indicated by reference numeral 130 in FIG. 1, i.e., the areas near where the first and second scribe line regions 110A and 110B intersect with each other. The embodiments described in FIGS. 2A to 2F may be equally applied to all scribe line regions disposed between die regions illustrated in FIG. 1.

Figure 2A:
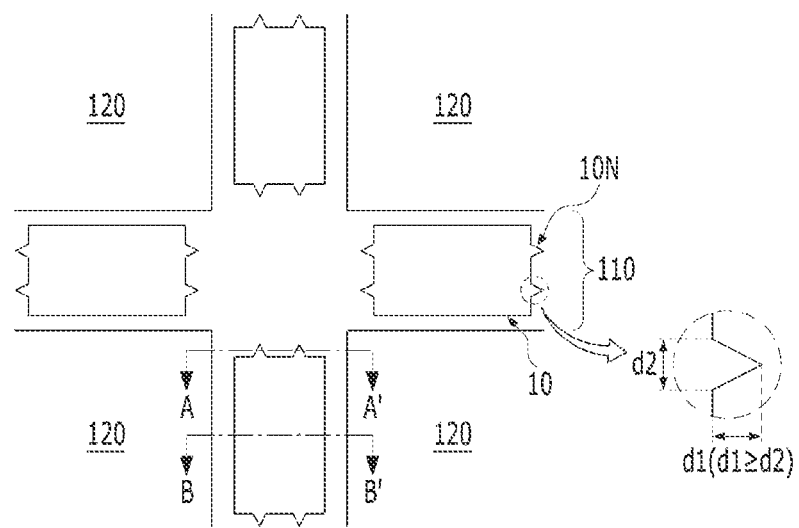
FIGS. 2A to 2F are plane views illustrating a semiconductor device according to other embodiments of the present invention.

As shown in FIG. 2A, one or more open areas 10 may be formed in the scribe line regions 110 and may include one or more notch patterns 10N. The open areas 10 may reduce an absolute amount of metal materials in the scribe line regions 110. The notch patterns 10N may perform as a stress-triggering to improve divisibility of a wafer by concentrating and transmitting a division stress during a wafer dicing process.

A material layer formed on a top portion of the scribe line regions 110 may be locally removed by the open areas 10 and the notch patterns 10N. The material layer may include a material that may function as an obstacle during a wafer dicing process. The material layer may include, for example, a metal material, and in particular may include metal materials constituting a top electrode of a capacitor formed together during a device process of the die regions 120 according to an embodiment of the present invention. Embodiments of the present invention are not limited thereto. The present invention may be applicable to any process in which a metal material is covered on scribe line regions during a device process of the die regions 120.

Both sidewalls of each of the open areas 10 adjacent to the die regions 120 may be spaced apart from the adjacent die regions 120 at a constant distance. Each of the notch patterns 10N may be formed at least on one sidewall of each of the open areas 10 that is not adjacent to the die regions 120. Each of the notch patterns 10N may be formed on both sidewalls of each of the open areas 10 not adjacent to the die regions 120. Each of the notch patterns 10N may be formed to indicate extending directions of the scribe line regions 110 in which each of the open areas 10 is disposed. For example, each of the notch patterns 10 N may be formed to indicate the first direction when each of the open areas 10 is disposed on the first scribe line region 110A (refer to FIG. 1) extending in the first direction. Each of the notch patterns 10N may be formed to indicate the second direction when the each of open areas 10 is disposed on the second scribe line region 110B (refer to FIG. 1) extending in the second direction. Each of the notch patterns 10N may be formed to indicate the respective extending directions of scribe line regions when the each of open areas 10 is disposed in the respective first and second scribe line regions 110A and 110B which respectively extend in the first and second directions.

Each of the notch patterns 10N may comprise a length d1 protruding from a sidewall of each of the open areas 10 and a width d2. In this embodiment of FIG. 2A, the length d1 of each of the notch patterns may be equal to or longer than the width d2 of each of the notch patterns, to maximize stress triggering. The one or more notch patterns 10N may be formed on at least one sidewall of each of the open areas 10 which is not adjacent to the die regions 120 or on both opposite sidewalls of each of the open areas 10 which are not adjacent to the die regions 120. The notch patterns 10N may be spaced apart from each other. In another embodiment, at least one or more notch patterns 10N may be formed on a sidewall of each of the open areas 10, and at least one or more notch patterns 10N may be continuously arranged without a gap.

The notch patterns 10N may induce crack stress to be transmitted in directions indicated by the notch patterns 10N when crack energy generated after stealth dicing and wafer expanding cut touches a metal thin film pattern. By inducing such a transmittal of crack stress to the die regions 120, it is possible to improve divisibility of wafer and to prevent an occurrence of film delamination.

Each of the open areas 10 may be formed together when a photo key is formed. According to other embodiments of the present invention, each of the open areas 10 may function as a photo key. According to other embodiments of the present invention, each of the open areas 10 may be formed through a separate mask process before or after a formation of a photo key. According to other embodiments of the present invention, each of the open areas 10 may be formed in a region spaced apart from a photo key.

Figure 2B:
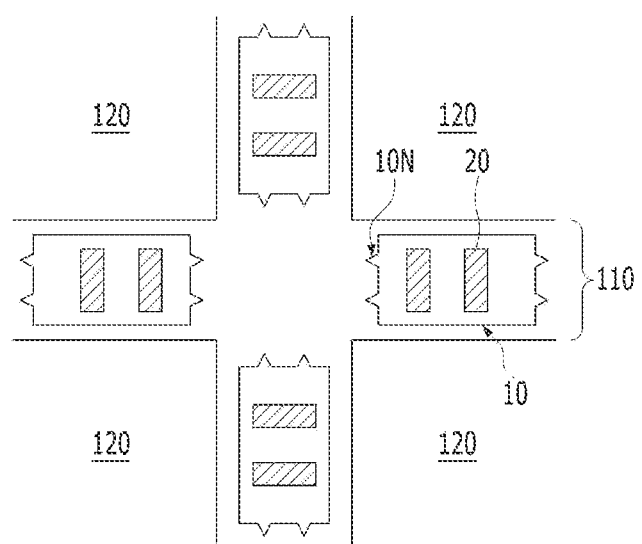
Figure 2C:
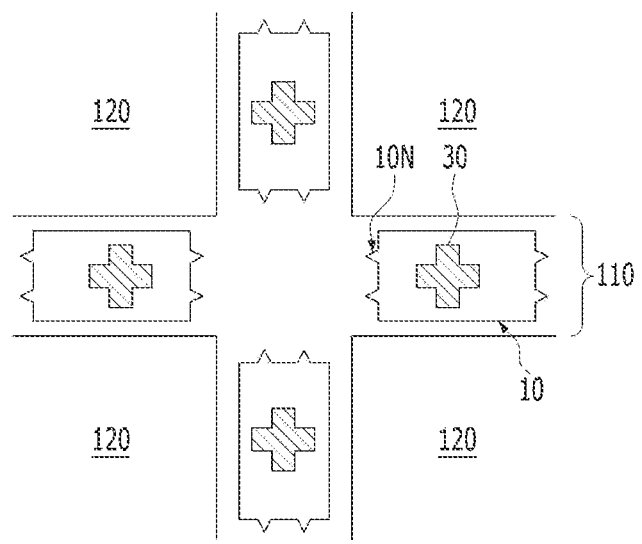
Figure 2D:
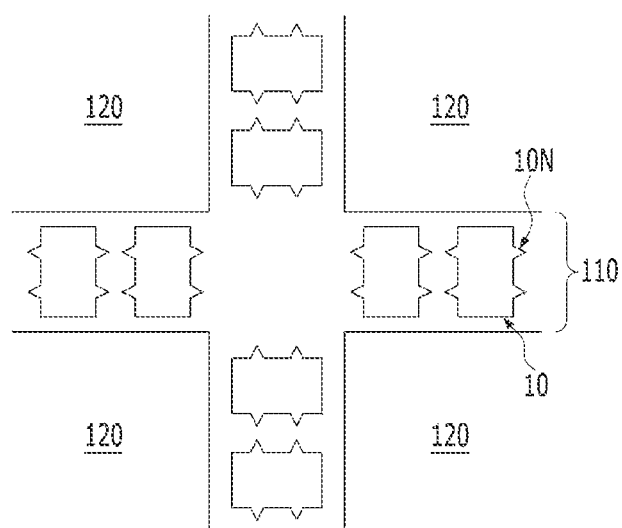
Figure 2E:
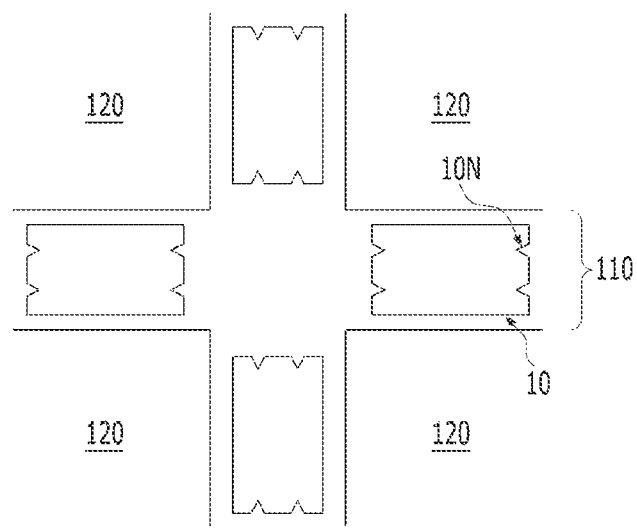
Figure 2F:
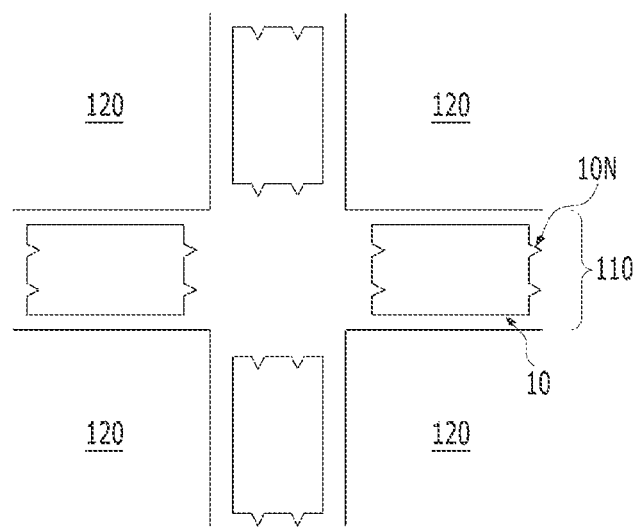

According to an embodiment of the present invention as shown in FIG. 2B, each of the open areas 10 may be patterned such that one or more overlay key patterns 20 for confirming an overlay with a lower layer may remain. FIG. 2B shows, as an example, that two overlay key patterns 20 remain in each open area 10, but the present embodiment is not limited thereto. According to an embodiment of the present invention as shown in FIG. 2C, each of the open areas 10 may be patterned such that an align key patterns 30 used for confirming alignment between a wafer and a device may remain in each of the open areas 10. According to an embodiment of the present invention as shown in FIG. 2D, a plurality of open areas 10 may be spaced apart at a constant distance inside of the scribe line regions 110 extending in the first or second directions in the open areas 10. For example, as shown in FIG. 2D, two or more open areas 10 may be formed spaced apart in each of the first and second scribe line regions 110A and 110B, but the present embodiment is not limited thereto. According to an embodiment of the present invention as shown in FIG. 2E, the open areas 10 may be patterned so that each of the notch patterns 10N indicates a direction toward the inside of the open area 10. According to an embodiment of the present invention as shown in FIG. 2F, the open areas 10 may be patterned so that each of the notch patterns 10N indicates only one direction. In other words, each of the open areas 10 may include each of the notch patterns 10N on one sidewall indicating a direction toward the inside of the open area 10 and each of the notch patterns 10N on another sidewall which is opposite to the one sidewall may be indicating a direction toward the outside of the open area 10. The described embodiments of the present invention illustrate various examples of the open areas 10. However, the present invention is not limited to the embodiments shown. It should be understood, that the skilled person having ordinary skill in the art of the present invention having read the described embodiment would envision other examples wherein a direction of the notch patterns 10N, a size and a number of the open areas 10 may be adjusted or disposed albeit differently nevertheless without departing from the scope and objects of the present invention.

A metal material may be formed on a top portion of the scribe line regions 110 by the open areas 10. An absolute amount of the metal materials in the scribe line regions 110 may be reduced, for example, by locally removing a metal material layer constituting a top electrode of a capacitor. Therefore, a dicing process may be performed more easily as a division energy during a wafer dicing propagates in a vertical direction of a wafer surface.

In addition, problems resulting from entirely removing a metal material from the scribe line regions 110 may be prevented in advance by locally removing a portion of a metal material formed on a top portion of the scribe line regions 110. In other words, problems such as a "not open" of a metal line contact plug or a short between a contact plug and a capacitor caused by residues or particles being concentrated on a sidewall of a pattern resulting from entirely removing a metal material from the scribe line regions 110 may be prevented in advance.

Figure 3B:
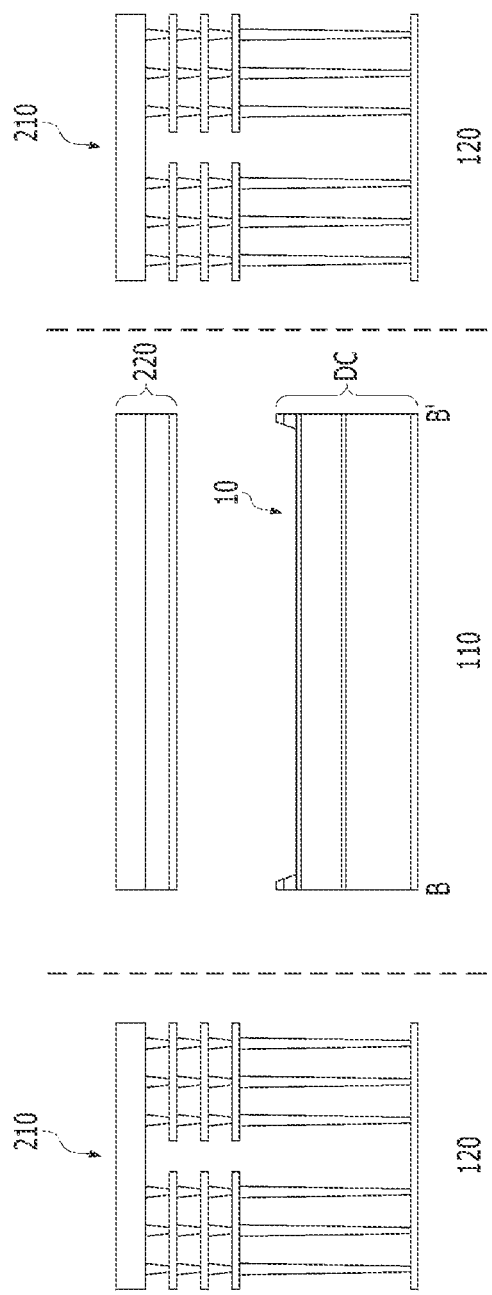

FIGS. 3A and 3B are cross-sectional views illustrating a semiconductor device according to other embodiments of the present invention. FIG. 3A is a cross-sectional view taken along line A-A' shown in FIG. 2A. FIG. 3B is a cross-sectional view taken along line B-B' shown in FIG. 2A. FIGS. 3A and 3B may include the same structures shown in FIGS. 2B to 2D. FIGS. 3A and 3B may also include the same structures shown in other cross-sectional views of all structures including open areas and notch patterns according to the embodiments of the present invention.

As illustrated in FIGS. 3A and 3B, the scribe line regions 110 may be disposed between neighboring die regions 120. A protection structure 210 may be formed in each of the die regions 120 adjacent to the scribe line regions 110. A portion of the die regions 120 adjacent to the scribe line regions 110 may be chip guard regions. The protection structure 210 may serve to protect a semiconductor device formed in the cell region.

A plate structure DC for a photo key may be formed in the scribe line regions 110. A wiring material layer 220 that can serve as a photo key during a formation of a metal line may be disposed on an upper portion of the plate structure DC. An insulation layer (not shown in drawings) may be disposed between the plate structure DC and the wiring material layer 220. Although not shown, a test device having the same structure of a capacitor in the cell region may be formed in the scribe line regions 110 adjacent to the plate structure DC for a photo key.

The plate structure DC may include a stacked structure of a metal material layer, an insulation layer, and a metal material layer. A metal material layer on an upper and lower portion of the insulation layer may be applied as a photo key serving as an overlay key and/or an align key during a formation of a semiconductor device in the cell region. An insulation layer may be made of multiple layers, and may further include a supporter. The supporter may be disposed between multiple insulation layers and suitable for preventing a capacitor from collapsing.

A top metal material layer of the plate structure DC and an upper electrode of a capacitor in the cell region may be formed of the same material and at the same time. The plate structure DC may hinder a die segmentation process during a subsequent wafer dicing process. Therefore, sawing stress may be concentrated on a direction in which the scribe line regions are extended by forming the open areas 10 which locally remove a portion of the plate structure DC as illustrated in FIG. 3B, and, in particular, by forming the notch patterns 10N as illustrated in FIG. 3A.

The above-described invention is not limited by the embodiments described or figures included herein. In view of the present invention, other additions, subtractions, or modifications are apparent to a person of ordinary skill in the art and are intended to fall within the scope of the appended claims.

What is claimed is:

1. A semiconductor device, comprising:
   die regions spaced apart from each other in a wafer and where semiconductor devices each including a capacitor are formed;
   scribe line regions disposed between neighboring ones of the die regions and covered with a metal material layer that covers an upper electrode of the capacitor;
   one or more open areas where the metal material layer is locally removed from the scribe line regions, each of the open areas including one or more notch patterns each indicating one of directions in which the scribe line regions are extended.

2. The semiconductor device of claim 1,
   wherein each of the open areas includes sidewalls adjacent to the die regions, and
   wherein the sidewalls are spaced apart from the adjacent die regions at a constant distance.

3. The semiconductor device of claim 1, wherein each of the notch patterns is formed at least on one sidewall of each of the open areas which is not adjacent to the die regions.

4. The semiconductor device of claim 1,
   wherein a length of each of the notch patterns is equal to or longer than a width of each of the notch patterns.

5. The semiconductor device of claim 1, wherein the notch patterns are formed on a sidewall of each of the open areas and spaced apart from each other.

6. The semiconductor device of claim 1, wherein the notch patterns are disposed on a sidewall of each of the open areas.

7. The semiconductor device of claim 1, wherein each of the open areas functions as a photo key.

8. The semiconductor device of claim 1, wherein an interior of each of the open areas includes a plurality of patterns that can function as a photo key.

9. The semiconductor device of claim 1, wherein the open areas disposed in each of the scribe line regions are spaced apart.

10. The semiconductor device of claim 1, wherein the metal material layer is to form a photo key.

11. The semiconductor device of claim 1,
wherein the scribe line regions include a first scribe line region extending in a first direction and a second scribe line region extending in a second direction, and
wherein the first scribe line region and the second scribe line region intersect at right angles to each other.

12. The semiconductor device of claim 1, wherein each of the notch patterns is formed on a sidewall of each of the open areas and indicates toward outside of each of the open areas.

13. The semiconductor device of claim 1, wherein each of the notch patterns is formed on a sidewall of each of the open areas and indicates toward inside of each of the open areas.

14. The semiconductor device of claim 11,
wherein the open areas disposed in the first scribe line region include the notch patterns indicating the first direction, and
wherein the open areas disposed in the second scribe line region include the notch patterns indicating the second direction.

* * * * *